(12) United States Patent
Balogh

(10) Patent No.: US 11,385,473 B2
(45) Date of Patent: Jul. 12, 2022

(54) 3D LIGHT FIELD LED-WALL DISPLAY

(71) Applicant: Tibor Balogh, Budapest (HU)

(72) Inventor: Tibor Balogh, Budapest (HU)

(*) Notice: Subject to any disclaimer, the term of this patent is extended or adjusted under 35 U.S.C. 154(b) by 98 days.

(21) Appl. No.: 16/966,258

(22) PCT Filed: Feb. 6, 2018

(86) PCT No.: PCT/HU2018/000005
§ 371 (c)(1),
(2) Date: Jul. 30, 2020

(87) PCT Pub. No.: WO2019/155243
PCT Pub. Date: Aug. 15, 2019

(65) Prior Publication Data
US 2021/0041718 A1   Feb. 11, 2021

(51) Int. Cl.
*G02B 30/27* (2020.01)
*G02B 3/00* (2006.01)
(Continued)

(52) U.S. Cl.
CPC ............. *G02B 30/27* (2020.01); *G02B 3/005* (2013.01); *G09G 3/32* (2013.01); *H01L 25/167* (2013.01);
(Continued)

(58) Field of Classification Search
CPC .. H04N 13/302; H04N 13/307; H04N 13/312; H04N 13/315; H04N 13/31; H04N 13/32; H04N 13/0404; G02B 30/27
See application file for complete search history.

(56) References Cited

U.S. PATENT DOCUMENTS

| 2007/0081340 A1* | 4/2007 | Chung | ...................... F21K 9/00 362/294 |
| 2013/0181884 A1* | 7/2013 | Perkins | ................. G06F 3/1423 345/1.3 |

(Continued)

*Primary Examiner* — Yuzhen Shen
(74) *Attorney, Agent, or Firm* — Ladas & Parry LLP

(57) ABSTRACT

Modular 3D light field LED wall display composed of uniform panels (10), connected to each other mechanically and electrically, each of the uniform panels (10) comprising—a LED backplane (30) comprising pixels (P), each incorporating multiple LED emitters (20), —an optical means placed over the LED emitters (20) to direct multiple light beams into multiple directions from each pixel (P), —the panels further comprising LED driver electronics (34) and connectors (35), in which—the LED emitters are individually controlled LED emitters arranged in a predetermined pattern of LED emitters within a LED pixel, —the optical means is realized as a panel optics (40) having the same size and form as the panel, comprising multiple optical surfaces, forming a lens array, containing integer number of straight oriented lenslets (42) with straight edges, corresponding to the pixel (P) arrangement, forming a seamlessly tile-able array, —the light beam from each LED emitter (20) is directed into one direction by the panel optics (40), and the light beams ($L_1 \ldots L_N$) emitted from the pixel (P) into the multiple directions cover a contiguous angular range a in a single lobe, where each of the light beams having a divergence ($\delta$) in order to provide a continuously changing 3D vision, —the multiple light beams ($L_1 \ldots L_N$) from all the pixels (P) generate a continuous 3D light field providing natural 3D view over a wide field-of-view (FOV) with a high angular resolution. Both large-scale horizontal-only-parallax (HOP) 3D light field LED wall displays and full-parallax panels based on backplanes with micro-LED arrays are described. Disclosed is further a method for displaying 3D images on a 3D LED wall display.

17 Claims, 10 Drawing Sheets

(51) Int. Cl.
*G09G 3/32* (2016.01)
*H01L 25/16* (2006.01)
*H01L 33/58* (2010.01)

(52) U.S. Cl.
CPC ....... *H01L 33/58* (2013.01); *G09G 2300/026* (2013.01)

(56) References Cited

U.S. PATENT DOCUMENTS

| | | | |
|---|---|---|---|
| 2015/0186097 A1* | 7/2015 | Hall | G06F 1/26 345/1.3 |
| 2015/0249820 A1* | 9/2015 | Saigo | G02B 30/27 348/55 |
| 2016/0373733 A1* | 12/2016 | Kroon | H04N 13/305 |
| 2017/0223344 A1* | 8/2017 | Kaehler | H04N 13/307 |
| 2018/0017801 A1* | 1/2018 | Chang | H04N 13/302 |
| 2019/0243149 A1* | 8/2019 | Iguchi | H01L 25/0753 |

\* cited by examiner

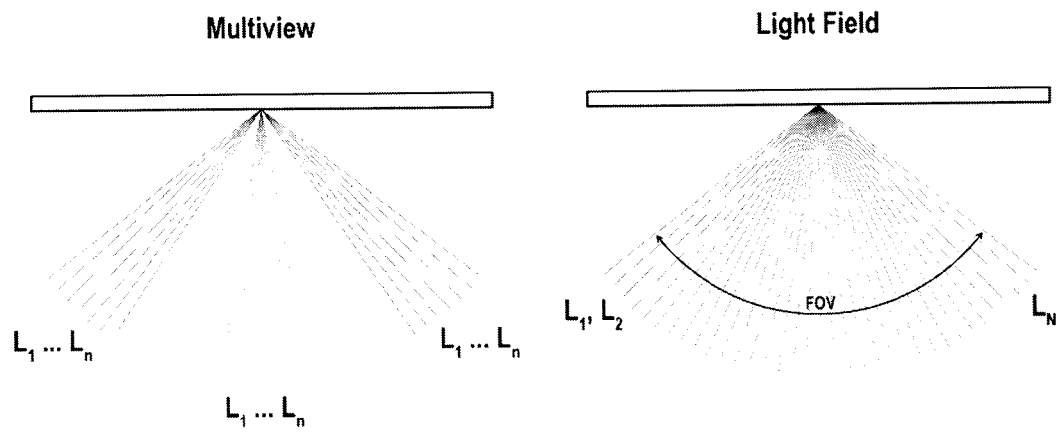
Fig. 1.a Prior art
Fig. 1.b Prior art
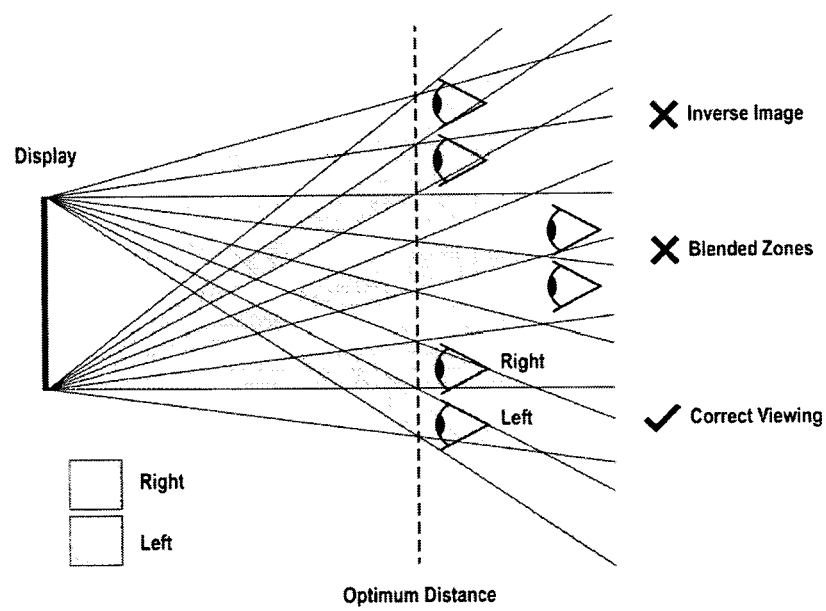
Fig. 2 (Prior art)

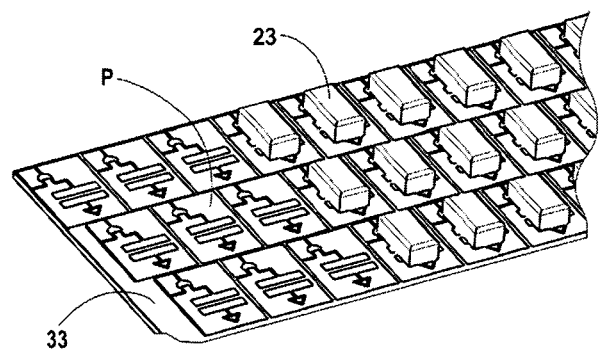
Fig. 10.a
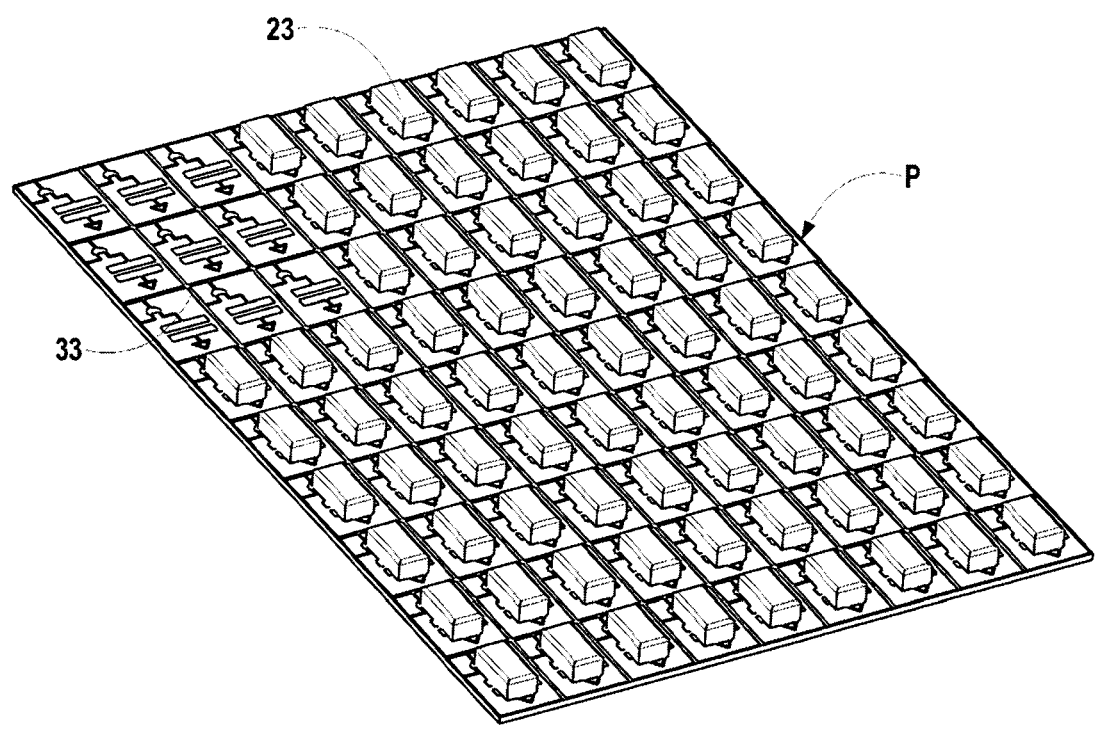
Fig. 10.b

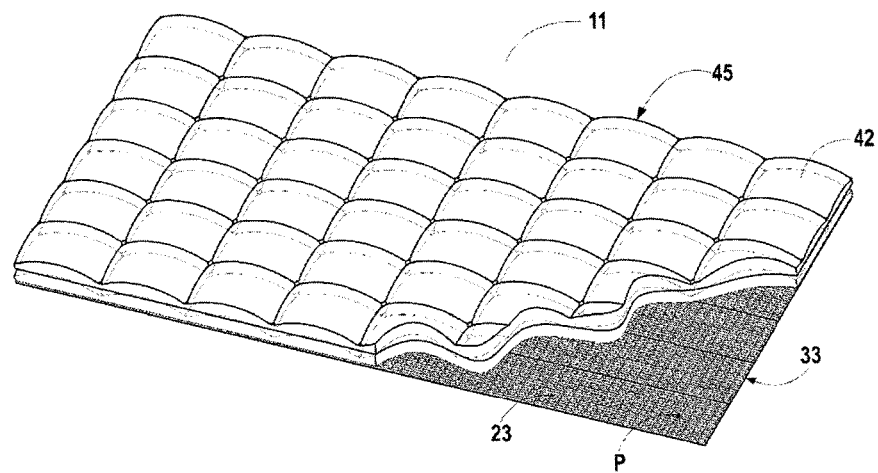
Fig. 11.a
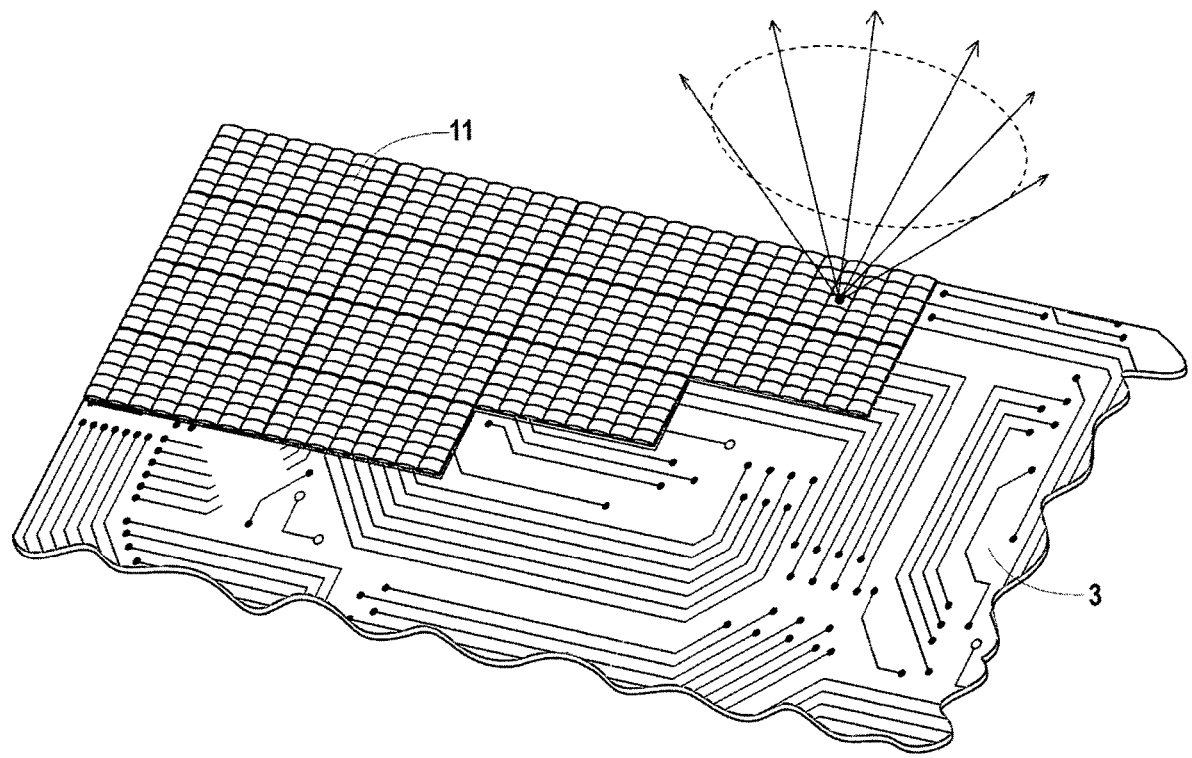
Fig. 11.b

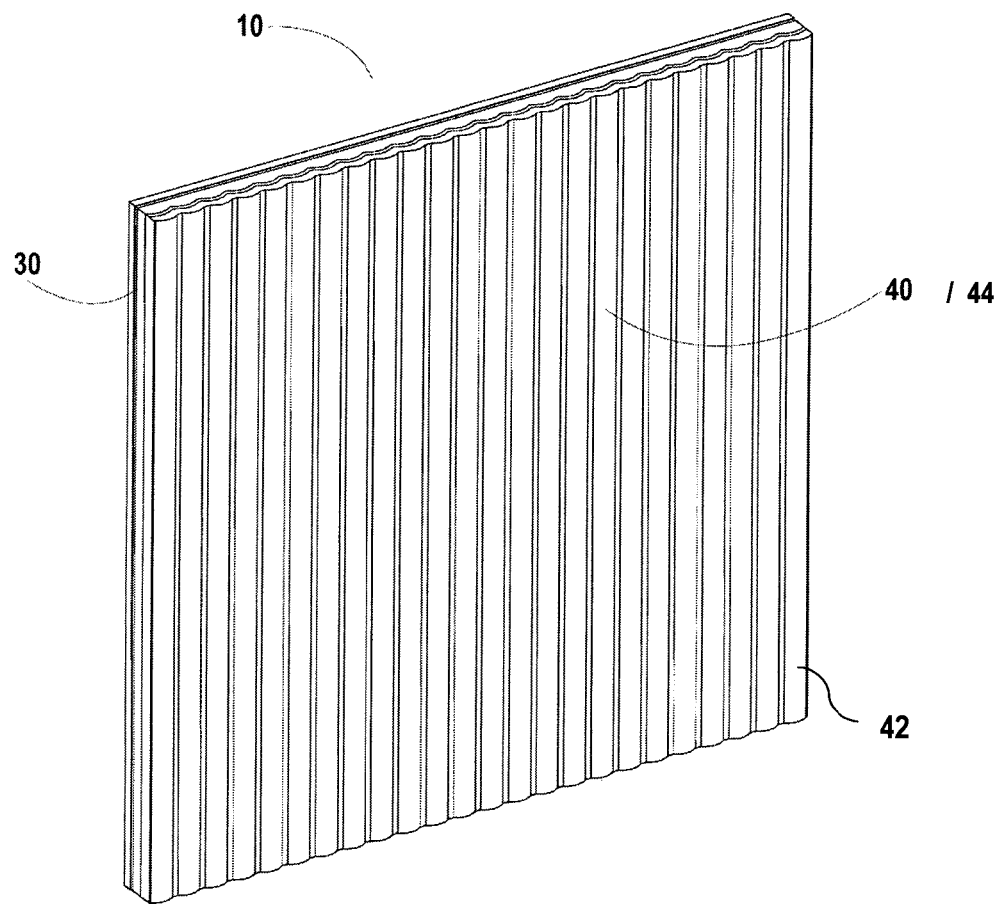
Fig. 12.a
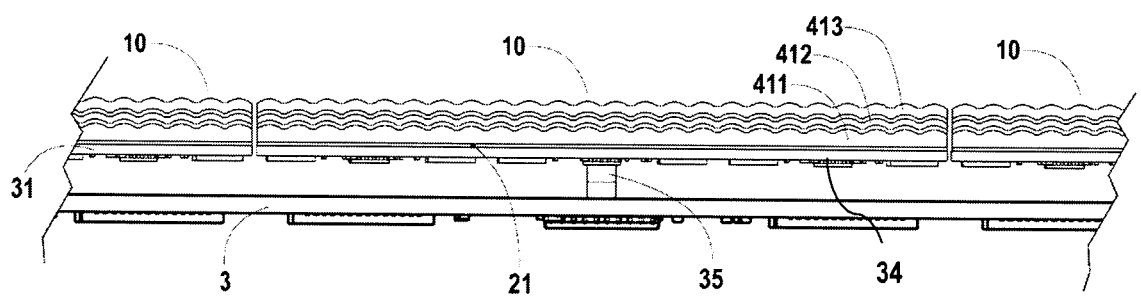
Fig. 12.b

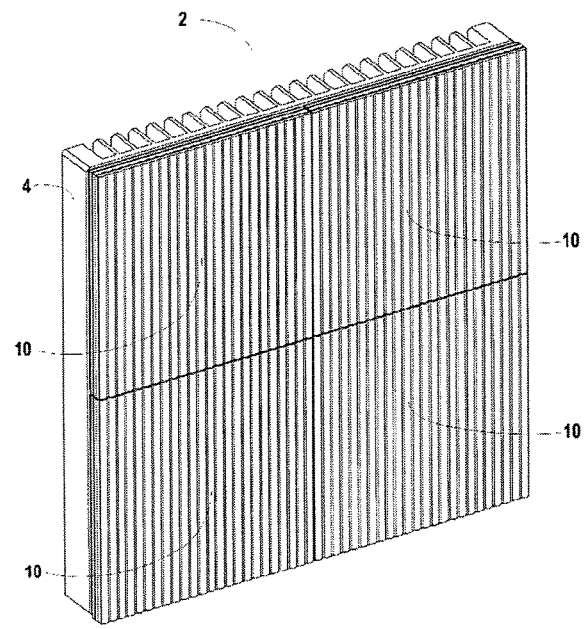
Fig. 13
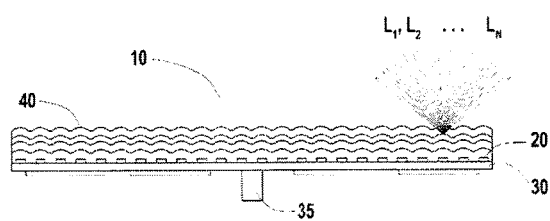
Fig. 14.a
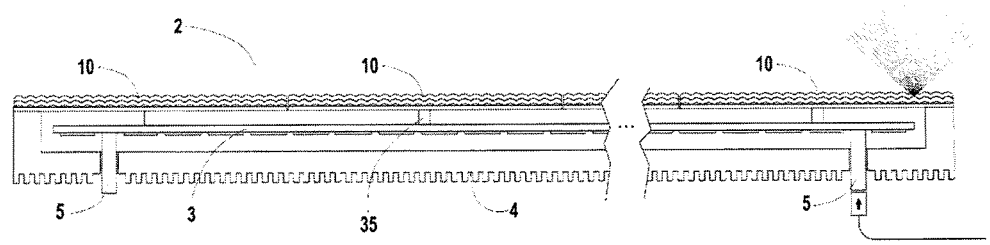
Fig. 14.b
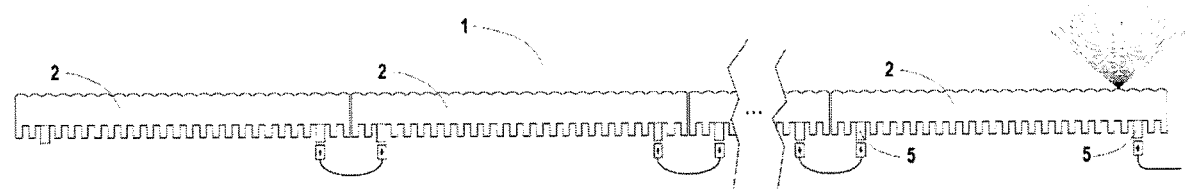
Fig. 14.c

3D LIGHT FIELD LED-WALL DISPLAY

RELATED APPLICATION

This application is an application under 35 U.S.C. 371 of International Application No. PCT/HU2018/000005 filed on 6 Feb. 2018, the disclosures of which are incorporated in their entirety by reference herein.

TECHNICAL FIELD

The invention relates to a method and apparatus for 3D displaying, describing modular LED wall style 3D light field displays.

BACKGROUND ART

3D Light Field displaying represent the next generation at 3D systems that can provide a natural hologram-like 3D view without glasses, or any restrictions, outperforming other 3D solutions.

Light Field is a general representation of 3D information that considers a 3D scene as the collection of light rays that are emitted or reflected from 3D scene points. The 3D light field representation is ideal for 3D displays, since the goal of 3D displaying is to reconstruct the visible light beams from a real or synthetic 3D scene, reproducing light beams into real space with the same parameters the human vision is capable to process: direction, position, intensity, color. In other words, the goal is to reconstruct the light field, as present in the natural view.

3D light field displays capable to emit multiple individually controlled light beams from each of their pixels into various directions, as if they were emitted from the points of objects behind screen, or crossing at the points in front of the screen, to display objects floating in the mid-air.

As of the potential technologies, LED displays in general, being emissive displays, offer very efficient operation. They can provide vivid colors and excellent contrast with real black levels, when they are off. They do not use back-light illumination, like LCD panels, where the light is absorbed according to the image information.

In addition, normal inorganic LEDs are much more efficient than organic LEDs (OLED). At OLED displays, although being emissive displays, the brightness is a critical parameter, since in most cases these are based on white emitting mechanism and the colors are created by color filters, loosing again significant part of the produced light, not mentioning other problems like the life-time, color shift, burning-in which is still an unsolved issue.

As can be seen, LED chips are ideal in display technologies, they are efficient enabling high brightness at reasonable power consumption, they provide unprecedented contrast, they can provide wide color gamut, close to laser emitters, but on slightly wider spectrum to avoid speckle.

Recently microLED chips, very tiny LED chips are transferred to active matrix backplanes, with transistors directly driving the chips, to form high resolution, high brightness, wide color gamut, efficient microLED displays, offering an alternative to OLED display panels.

LED wall displays became widely used in large-scale displaying. The modular character of these displays makes them a very attractive option to build any size, any aspect, any shape displays, where even curved surfaces are possible. Relative to their size, the LED wall modules can be considered a flat panel, lightweight solution that can practically match several cases of application, like indoor & outdoor advertisement displays at public spaces, shopping malls, airports, visually impressive concert and stage technologies, TV studios, sports events and stadiums, architectural components, including both permanent and easy-to-build temporary installations.

While LED walls were considered mostly for large-scale applications with reduced LED pixel pitch sizes to 1 mm, or even below, a full-HD display can come smaller than 2 m, which is already the range for TV sets in the living rooms. In this trend LED wall displays will compete son with consumer category single panel displays even from 70-80" diagonal. Offering superb quality and flexibility, LED displays will dominate the future displaying, penetrating to consumer markets and wide range of applications, as well.

The basic goal of displaying is to give back the real world or synthetic scenes with the highest perfection. Evidently in all forms of visualization the need for 3D will be there, because that's how we see the world. While we are approaching the rational limits of 2D displaying, 4K, 8K, HDR, HFR, wide color gamut or more, which does not make any difference for the average users, what is missing is to perfectly visualize 3D, to overcome the limitations of stereo and multiview glasses-free 3D systems and create real 3D displaying capability that is not yet solved at LED wall displays.

As for LED wall displays, we could see stereo 3D solutions (Sony, CCDL). These are passive, polarization based solutions, where left&right eye separation is provided by respective circular polarizing filters stuck directly on the LEDs. This however halves the resolution and the polarization foils gave a shiny appearance to the display. Another solution is the double speed operation of the LED walls, showing L&R images in rapid succession. These needs however synchronized active shutter glasses, which require continuous care because of the battery, and for the same reason bulky and relative expensive. 3D systems requiring glasses worn by the viewers are not viable, particularly not at public places where people are on the move, to give out and collect, clean glasses, not mentioning stereo 3D systems' inherent limitation in showing correct depth cues, optical contradictions that makes them visually less acceptable.

There were attempts to put a lenticular lens sheet on TV sized LED display to make glasses-free 3D multiview effect (https://www.dimenco.eu). The problem that LED walls with 1 mm pitch does not allow high-quality 3D displaying with sufficient resolution and viewing range. To distribute the resolution loss difference in between the horizontal and vertical pixels 300, slanted lenticular lens array 400 is applied. This on one hand will result in strange seen pixel shapes, particularly visible at straight lines, but as an additional limitation, it will exclude the option to scale up displays by seamless tiling. In multiview systems, the views are appearing periodically, consequently there are always invalid and blended zones, where the 3D view is inverted or the views are mixed. For example, for a typical multiview system with 9 views, views 1 to 9 represent the viewpoint changing from left to right. In a non-continuous viewing range, in between the discrete narrow lobes of views, there will always be positions, where the left eye sees right view from another lobe and the right eye sees the relative left view, or both eyes both more views, as illustrated in FIG. 2. In these zones the 3D vision will be offended, inverted perspective or fuzzy, ghosted images will appear. In multiview systems, in the viewing range there are even fewer regions where correct 3D view can be seen, and when a viewer moves to see the 3D objects closer, the 3D view immediately collapses. Viewers should be at fixed sweet-spots to see correct 3D, these are the so called diamond shaped spots, representing overall a smaller area, than the invalid and blended zones in the viewing area, that prevented the wider public acceptance of glasses-free 3D multiview systems.

For large-scale outdoor advertising 3D displays, laser scanning pixel solution is also known (http://www.trilite-tech.com/). Each pixel contains 3 laser diodes, plus scanner, control and feedback electronics resulting in unacceptable physical dimensions, i.e. the pixel pitch is approx. 2 cm, along with narrow field of view (FOV) due to the limited optical scanning angles, while the cost of an individual pixel comes in the range of a complete laser pico-projector engine that result in an enormous final system cost for larger assemblies.

A pixel element was described in U.S. Pat. No. 6,736,512 by Balogh to assemble 3D displays, each element containing a set of individually addressable point light sources arranged in a line and an optical imaging means. However, using such a pixel element to build 3D displays is inflexible, since the pixel size, the FOV and the number of views is fixed. Any change in those parameters would require another different pixel element, including different chip structure, driver circuits, optics and packaging, that makes the pixel element less viable in building various displays. [WU1]Beyond this, individually adjustable pixel elements make the display alignment and calibration processes more complex.

A similar pixel element is disclosed by Zhengzhou Central China Display Laboratories Ltd. (published as CN 104199197 and CN 104200757), both relate to the same solution, the first discloses the lens, while the second discloses the display built on it. They describe also an element with a lens above multiple LED chips. The LED pixel elements cannot come close to the theoretical maximum of optical density, since it is limited by principle by the physical sizes of the chips and gaps, considered as a basic unit in the lay-out. At the most is complex element described, there are 8 RGB LEDs arranged in-line under the lens, 24 separate elements per pixel (3 in the row×8 subsequent rows), resulting in at least 15-20 mm pixel pitch, with 8 views in a narrow angle due to the single element optics. The arrangement otherwise is similar to the above referenced Dimenco/ex Philips slanted lenticular system, as such, there are no straight boundaries in the layout to allow seamless tiling, so either large, 8 view 3D display assemblies in one piece can be built, or smaller assemblies tiled with bezel only in between them. Because of technical difficulties in practical implementation, this theoretical solution did not find a way in practice.

As already indicated above, the need for 3D is there at widely used LED displays, which is still not satisfied. As simple attempts stereo glasses 3D systems were already shown. To realize a glasses-free 3D effect an obvious approach is to place a lenticular sheet on a LED display. This however raises several problems.

At mainstream LED displays the pixel pitch is typically in the few mm range, from 10 mm down to 3 mm, and even the finest pitch 1 mm LED display the resolution is a limiting factor. Under the lenslet there are more pixels, each belonging to other emitting directions, in other words a 3D pixel contains so called sub-pixels, e.g. the 3D pixel is larger than the 2D sub-pixels, each being itself a LED. In 3D displays, the final screen resolution is divided by the number of views, in case of having just 9 views, which is very typical for lenticular multiview displays, the resolution will be ⅑ of the original underlying display.

Lenticular sheets, representing single element optics from pixel's point of view, are limited in the angle they can send the light coming from neighboring pixels. The viewing range with having light beams of proper optical quality (far field spot size) is limited to 30-40 degrees. On the other hand, having limited number of views and to keep the 3D effect, even narrower angles are set, say for a 9 views display typically 20 degrees. This narrow viewing range with the same view images is repeated then in a wider FOV. Lenticular systems typically realize multiview operation with the mentioned drawbacks of invalid or blended zones, where the right eye sees the left view, or both, and vice versa, and where the 3D view collapses, we refer again to FIG. 2.

Horizontal parallax is more important than vertical parallax. Our eyes are displaced horizontally, we are moving on the floor horizontally in front of the screens, thus multiview systems provide different views varying horizontally only. They are typically horizontal only parallax (HOP) systems. As such, distributing light into multiple horizontal directions from pixels in different horizontal positions would reduce the horizontal resolution, while leaving the vertical resolution unaffected.

To balance the asymmetric resolution loss over a display surface with the pixels in horizontal rows and vertical columns 300, the lenticular sheet is slanted 400 to transform vertical positions into different horizontal positions relative to the lenslets. Slanted geometries however always result in fraction of pixels at the borders of the lenslets on a regular arrangement of pixels, see FIG. 3. On the edge of the slanted lens array there will always be visible artifacts, missing views, total internal reflections that does not allow seamless tiling of the panels. In the referenced prior art solution a single lenticular sheet had to be placed over the whole display screen to obtain undisturbed view, giving up the modular character of the LED display.

DISCLOSURE OF THE INVENTION

The objective of the invention is to provide a 3D glasses-free LED wall display with a special modular structure enabling true 3D light field displaying, capable to emit from each pixel P a large number of individually controlled light beams into various directions over a wide field of view (FOV) in order to provide a continuous 3D vision with a high angular resolution. See FIG. 1.b.

This objective is achieved in an aspect of the invention by a modular 3D light field LED wall display according to claim 1, and a method according to claim 15.

The 3D light field LED display is composed of uniform panels 10, each of the panel comprise a LED backplane 30, comprising pixels P, each incorporating multiple LED emitters 20, an optical means is placed over the LED emitters 20 to direct multiple light beams into multiple directions from each pixel P.

The light beams from each LED emitter are directed into one direction by the panel optics and the light beams ($L_1 \ldots L_N$) emitted from the pixel into the multiple directions cover a contiguous angular range α in a single lobe. Covering the angular range α contiguously means, that ideally the light beams with a divergence of S do not overlap, or there are no angular gaps between the emitted light beams The number of LED emitters 20 is selected in accordance with the viewing directions, the number of the light beams N to be emitted from a pixel P, so that the light from each LED emitter 20 is directed into one single direction, depending on the LED emitter position in the pixel area p.

As an example, in case the FOV is set to 100 degrees and the angular resolution of the 3D display is set to 1 degree (which results already in an acceptable 3D depth quality or field-of-depth, FOD of the display), then 100 individually controlled light beams should be emitted from each pixel P, where the divergence of a light beam is 1 degree, i.e. quasi-collimated light beams covering 1 degree lobes each.

The optical means can be realized as a panel optics having the same size and form as the panel, comprising multiple optical surfaces, forming lens array, containing integer number of straight oriented lenslets with straight edges, corresponding to the pixels' P arrangement, forming a seamlessly tile-able array.

We describe a LED panel 10 structure and corresponding panel optics 40, which offers true 3D light field displaying providing large number of non-repeating views over the whole FOV, allowing natural 3D view in a wide angle without invalid zones, disturbing artifacts, opposing multiview, and which can seamlessly be tiled to build modular freely scalable 3D LED wall displays.

Advantageously, for 3D light field LED wall display assemblies, multiple panels 10 can further be organized into cabinets 2, as larger units, that can help the practical assembly of larger scale displays. The panels 10, further comprising LED driver electronics 34 and connectors 35, will be connected electrically and mechanically to a common control unit board 3 and mechanics 4, respectively to form a cabinet. Thereby a cabinet 2 comprising multiple panels 10 and control board 3, itself represent already a fully functional 3D light field display unit.

To display true 3D images much more light emitters are needed than for 2D, which is a challenge for LED displays having a packaged LED or LED chip 22, as a 2D sub-pixel. The pixel P size of a 3D display and the number of light beams N to be emitted from the pixel P are conflicting parameters.

We propose arrangements that go up to the theoretical limits, where the LEDs are arranged to reach the highest optical density, solving the problem of the resolution for 3D displaying, and a multilayer panel optics 40 that surpass the limitations of single element optics, having properly oriented periodic features allowing seamless tiling, that would be impossible for slanted structures.

We realized, that at 3D LED displays the number of independent light beams N that can be emitted from a given pixel P depends only on the size of the active light emitting area E of the LED chips 22 used. We arrange the sub-pixel SMD LED packages 21 or LED chips 22 in the pixel area shifted substantially corresponding to the size/extension $E_x$ of the light emission area E of the chip in the shifting direction. In this case we reach the optimum, the theoretical maximum number of directions from the given pixel P size.

Various lay-outs can be outlined, how to arrange the LEDs, i.e. the sub-pixels in the (3D) pixel area p, the sub-pixels can be arranged in more rows, the rows can be shifted relative to each other, but there is always a maximum for the optical performance of the 3D LED display regarding the resolution and the number of views, i.e. the pixel P size and the maximum number of independent light beams that can be emitted from the pixel P: $p_x = E_x * N$—where $p_x$ is the horizontal pixel size, $E_x$ the horizontal size of the emission area E of the LED emitters 20, N is the number of individually controllable light beams emitted from the pixels.

In displays, the pixel aspect is expected to be symmetrical, i.e. $p_x$ is equal to $p_y$, to have the same horizontal and vertical resolution. In principle, it is possible to play with different horizontal/vertical resolution to, but the critical factor is the horizontal extension $p_x$ of the pixel. While the pixel size is proportional to the number of light beams to be emitted, the pixel area is proportional to the square function of the pixel size, thus the larger the area, the more chips can be placed there. Larger pixels, in general, can be more effective for 3D LED displays.

Following the proposed method much higher density optical lay-outs can be achieved, than the physical size/dimensions L of the SMD LED packages 21 or LED chips 22 and the necessary clearances c would allow. By this approach all the technological disadvantages can be eliminated, which is significant at SMD LED packages 21, LED chips 22, i.e. the ratio of the active vs. inactive areas, like the mechanical package envelop, or at LED chips 22 the bonding, other dark substrate structures relative the active light emitting window E, to reach the theoretical maximum for high density optically arrangements, that is crucial to realize 3D LED light field displaying, enabling continuous view.

The divergence S of the individual light beams emitted from a pixel P depends on the extension of the active light emitting area E of the LED emitter 20. With optically densely arranged LED emitters 20, substantially shifted with d=E, the light beams emitted from optically adjacent touching light emitting areas E in the pixel P will continuously cover the emitting angular range α.

The divergence δ will be equal to the emitting angular range α divided by the number N of the LED emitters 20, δ=α/N, practically in the optimum case the divergence δ is equal to the angular resolution of the display. All pixels together will generate a continuous 3D light field on the FOV. Although the FOV of the display is strongly related to the emitting angular range α, but in the near field they can be different depending on the possible definitions of the FOV, e.g. in case the shape of the viewing area is defined where viewers can see 3D on the entire screen. In the far field however, when looking at the 3D display from a distance, the FOV becomes equal to the emitting angular range α. For the simplicity in the description we follow this consideration not differentiating the values and not dealing with various FOV definitions of secondary importance.

Of course in practical systems the shift d can be smaller or larger than the theoretical optimum value regarding other factors, like different sized emitting area for the different type/color of LED chips 22 used in the panels 10, or certain rounded or integer numbers followed in the design. The optimum shift however advantageously chosen around the average extension of the light emitting area E, say good arrangements can be set with shifts ½ up to the 10× size of $E_x$.

In case the shift is smaller, e.g. ½ $E_x$, the neighboring lobes of light beams will partly overlap and crosstalk will appear between the views, causing 3D ghosting effect. In case the shift is larger, e.g. 2×$E_x$, then gaps will occur between the light emitting areas E, causing perceivable inhomogeneity in the 3D image. This second effect however can be reduced by using slightly defocused panel optics 40, or incorporating given diffusing functionality in the overlaid optical layers 41 of the panel. Using such optical compensation can make feasible looser lay-outs, as well, where for some technology reasons the physical dimensions of the SMD LED packages 21, LED chips 22, or necessary minimum clearances c cause an obstacle to reach optimum density arrangements.

Along with defining the optimum density arrangements, in determining the proper sizes for the panel 10 given integer numbers should be considered to result in seamlessly tile-able modular panels 10. While having fully-dense LED chip 22 arrangement within the pixel area p, it is advantageous to set a gap g in between the pixels P to separate them. For seamless tiling, for the same reason an empty border area is set along the edge of the panels 10, having the width of less than the half of the gap g, as in between the pixels. Hence, when joining the modules, the gap will be the same between the modules as the gap g between the pixels in the modules.

The number of SMD LED packages 21 on the panel 10 equals to the product of the individually controllable light beams N and the number of pixels P, and 3 times of this in case of using separate RGB LED chips 22. The horizontal and vertical size of the panel 10 is an integral multiple of the pixel size $p_x$, $p_y$ with the gaps and the of the number of pixels in the horizontal and vertical directions, PX and PY respectively. PX and PY stands for the resolution of the panel 10. For square shaped panels 10, PX=PY, assuming 1:1 aspect pixels, $p_x=p_y$, while other panel 10 aspects can also be practical, like 4:3 or 16:9, to build similar aspect final displays. To obtain advantageous configurations, the number of individually controllable light beams N, panel resolution PX, PY, the size (footprint) and number of channels of the LED driver chips 34 and the mechanical dimensions of the panel 10 should match.

The role of the panel optics 40 is to direct light from the LED emitters 20 into various directions. There are several challenges the dedicated panel optics 40 address.

For light field displaying, each of the light beams $L_1 \ldots L_N$ should be individually controllable, means that light from the corresponding individually controlled LED emitter 20, passing through the panel optics 40, should go into one and only one direction. Light beams are emitted from LED chips 22 into a very wide angle, it should be avoided that they can exit from the panel optics 40 in another direction, or at another pixel P position, e.g. getting out through the lenslets 42 belonging to a neighboring pixel P. This is opposing multiview systems, where this is not a problem, rather a typical characteristic repeating same few views over the viewing range, due to the uncontrolled leave of light beams through the neighboring pixel lenslets 42. At 3D light field reconstruction, the panel optics 40 can only transmit light from the underlying pixel area p, while blocking light from the LED emitters 20 located in neighboring pixel area p.

In order to create a continuous periodic pattern to be laid over the LED emitter 20 array, the optics belonging to a pixel, i.e. the lenslets 42 cannot be bigger than the pixel area p and half of the gap g around it. This size limitation is particularly challenging, if wider angle optics should be designed, since wide angle optics tends to be large, like fish-eye optics, relative to the source area. To provide unrestricted 3D view for multiple freely moving viewers on a wide FOV, the panel optics 40 should work on wide angles. Simple lens arrays represent single element optical systems, they are not capable for wide angle operation, to get around this we apply multiple optical layers 41 in the panel optics 40 that can be stacked, comprising multiple optical surfaces, apertures, eventually diffusing functionalities, shading, optical coatings, etc.

The light from each LED emitters 20 should be collected and collimated. Optically for ideal point-like sources collimation would mean focusing at the infinity to achieve minimum divergence. This is also true for HOP systems in the horizontal direction, even if there is no deflection vertically. The divergence δ of the light beam is related to the active light emitting area E size, and the optical system should resolve all LED emitters 20 in the far field. In other words, the angular resolution of the optical system should be well below the value coming from quotient of the FOV and the number of LED emitters 20 in the pixel, also equal to N. The required angular resolution should be smaller than FOV/N. To achieve proper far field spot sizes on a wide angle projection requires multiple element optics.

To assemble a modular 3D display without visible marks, the panels 10 should be seamlessly tiled. A lens array 43 of straight oriented integer number of lenslets 42, belonging to the integer number of not divided pixel areas p, that excludes slanted structures, constitute the optical plates 46. The panels 10 are independent, no light can enter from the neighboring panel, which could lead to light rays exiting from the panel into an incorrect direction. If the above criteria at the edges is met, and light only form the own pixels' area p can leave the panels, no dark marks, or ghost images will appear at the joinings. The optical plates 46 are exactly of the size and shape of the panel 10, and the LED backplane 30, allowing seamless tiling, sometimes also referred to as bezel-free tiling.

The LED panel optics 40 is realized as stacked optical plates 46 of multiple layers of lens array 43, where the size of lenslets 42 arranged in the plates 46 does not exceed the size of the pixels P and their period corresponds to the pixel layout. The lenslets 42 project collimated light beams into a wide angle range only from LED emitters 20 located in the corresponding pixel area, so that each LED emitter 20 at a different position in the pixel area p is associated to one and only one emitting direction in the FOV of the display.

As an advantageous two-layers basic embodiment, a primary lens layer 411 over the LED emitters 20 creating the directions through focusing the beams into an aperture, a layer with apertures to filter out geometrically distorted beams and a secondary lens layer 412 to correcting and retargeting the beams. For HOP systems cylindrical lens arrays 44 are used with vertical aperture stripes, where the cylindrical lenslet 42 focuses horizontally only, while for full-parallax spherical optics 45 is used and spherical apertures. Of course both for the cylindrical and spherical symmetry optical systems aspherical optical surfaces can also be used.

For full-parallax 3D imaging enormous number pixels are needed. While for a 100 view HOP system 100× pixels are used for 100 views, for full-parallax the same performance comes to 100×100, that is 4 orders of magnitudes more pixels than for 2D. Say, from a 4K 2D display panel, a 38×21 (3D) pixels P full-parallax 3D display could be created. Further to resolution issues, the size is also problem. With usual display panels the 3D pixel P size would come too large. Even with state-of-the-art 700-800 ppi panels, the pixel P size would come 3 mm for a 100×100 view system and 25×14 pixels P on ~6" diagonal mainstream mobile phone display panels.

Theoretically microdisplays could offer a better option, for the state-of-the-art, with 5-micron pixel pitch (not dealing with colors by now), however the ratio of the active window and the mechanical frame around puts an obstacle in the seamless tiling. Several solutions were suggested for the tiling, to extend microdisplay pixel surfaces for a larger screen, but it speaks for itself that no artefact-free operable solution exists as of today.

Using the proposed scheme, full-parallax 3D LED display panels 11 can also be realized based on microLED chips 32 and TFT backplanes 33. The extremely small microLED chip 23 sizes, enabling even 6000 ppi densities, represent a viable option for higher density full-parallax arrangements with practical pixel P sizes. The panel 11 consists of a backplane 33 containing microLED chips 23 or micro-LED array assembled with an optical overlay 40. The control is all solved on a multilayer control board 3 PCB. The microLED chips 23 can be transferred onto the backplane 33 distributed in a periodic pattern over the entire backplane 33 area, without the need of larger inactive frame around the pixel areas p than the normal pixel gap g set.

The lenslets 42 accept light from the whole pixel area p and organized in a periodic structure with optical surfaces 41 covering precisely the pixels' area p up to edge of the panel 11. At the edges of the panels' there is an inactive boundary with less than the half of the gap g as in between the pixels, to consider mechanical tolerances, as well. The panels 11 can be tiled and the gap in between the two panels 11 will be exactly the same, as the gap g in between the pixels on the panels 11, thus a continuous pixel period can be obtained resulting in seamlessly tiled 3D display surface.

For larger-scale full-parallax 3D LED displays in particular, with huge number of LED chips 22 required, the modular approach is the only viable solution.

BRIEF DESCRIPTION OF THE DRAWINGS

The invention will hereinafter be described on the basis of preferred embodiments depicted in the drawings, where FIG. 1. a, b Compares the multiview and the 3D light field displaying principle FIG. 2 Illustrates the principal limitations of multiview systems FIG. 3 Shows a slanted lenticular lens array 400 and the underlying pixel matrix in multiview systems FIG. 4 Shows a LED chip emitting area specific layout for RGB SMD LED packages with straight oriented lens array FIG. 5 Shows the LED chip layout with LED chips shifted corresponding to the emitting area E size FIG. 6 Illustrates the chip-on-board (COB) structure, showing LED chips grouped in the pixel areas p, directly bond to the PCB FIG. 7 Shows a preferred optical embodiment with two layers of lens array and apertures FIG. 8 Illustrates an example of decoupling the SMD LED packages and the optically active LED chips, enclosed in physically separate, differently oriented SMD LED packages, in a high-density pixel P arrangement FIG. 9 Shows an alternative, higher-density RGB SMD LED package pixel P arrangement with shifted rows FIG. 10.a Shows a magnified portion of a HOP pixel with shifted microLED chips on a TFT backplane FIG. 10.b Shows a full-parallax pixel arrangement of microLED chips on a TFT backplane FIG. 11.a Illustrates a full-parallax microLED panel 11 with the microLED chips 23 on the backplane 33 and the optical overlay 40

FIG. 11.b. Illustrates full-parallax microLED panels 11 on a control board FIG. 12.a. Shows a HOP panel 10 with the panel optic 40 with cylindrical lens array FIG. 12.b Is a side view of HOP panels showing the optical layers, the LED backplane, with the driving electronics on the back side, connected to the control board FIG. 13 Shows a cabinet of completely assembled panels with the mechanics enclosing the control board FIG. 14. a,b,c Shows the overall modular architecture of the system with panels, and the cabinets composing the tiled 3D light field LED display FIG. 15 Shows the seamlessly tiled 3D light field LED wall display FIG. 16 Shows the complete LED wall display assembly from the back, with the mechanics, incorporating the cooling and the control boards without the cabling FIG. 17 Shows a complete seamlessly tiled HOP 3D light field LED display with mechanical framing FIG. 18 Shows a complete seamlessly tiled full-parallax 3D light field LED display used in horizontal configuration.

DETAILED DESCRIPTION OF EMBODIMENTS

Figure 3:
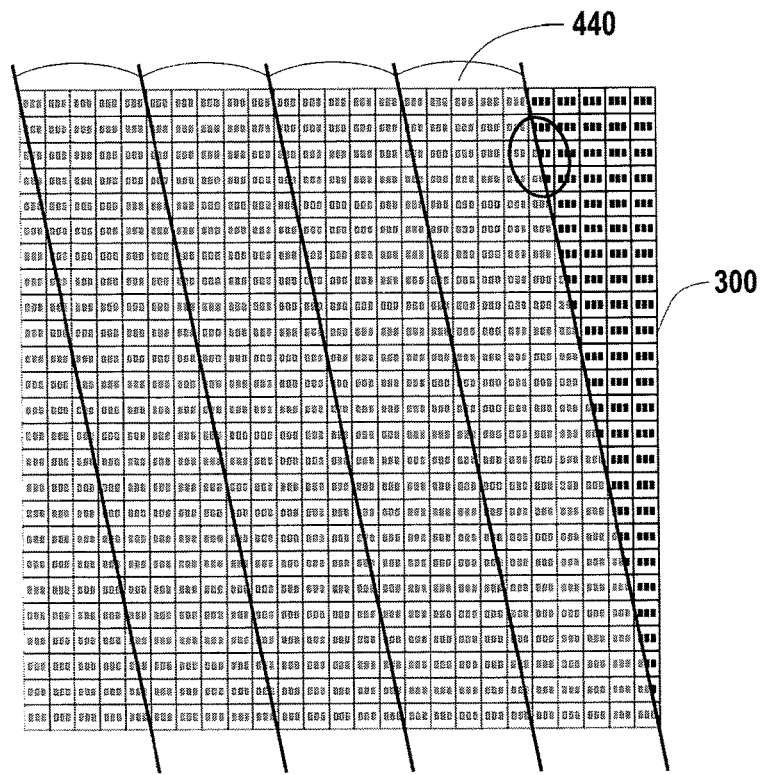

As explained above, a 3D image contains more information than a similar 2D, thus 3D displays should have more pixels, or higher speed components to deliver an increased optical and processing capacity, otherwise the 3D image will be compromised. During light field displaying we reconstruct the light beams, as present in the real view. 3D light field displays can provide a natural 3D view on a wide viewing range, without any restrictions for the viewers, they provide various depth cues, not just binocular, but also motion parallax. The viewers can look behind the objects, which can be both behind, or in front of the screen. At light field displaying there is a continuous view on the whole FOV, no picture jumps, no optical contradiction, or discomfort. No need for positioning, or tracking, thus unlimited number of freely moving viewers can see the 3D scene, allowing a social experience and collaborative scenarios with use comfort.

To build up high-quality 3D views, large number of independently controllable light beams $L_1 \ldots L_N$ are needed, consequently to realize high-quality 3D displaying with physical means, large number of pixels are needed. To have an acceptable 3D view, say, in just 100 degrees FOV, with 1-degree angular resolution, which is just enough for screen sized depths, we should have minimum 100-times of the pixels we expect for the similar 2D resolution. We have 4K or 8K components, as the edge as of today, which is however not enough, we have to use orders of magnitudes more pixels. We had these considerations and came to the modular approach to create a future-proof 3D light field display system.

In other words, to build high pixel count systems the modular approach is a very effective way, not only in removing technology limits, but can be vital in handling real-life issues, like production yield, when constructing actual systems, or practical points at the later use of such system, like the maintenance, or the easy replacement of broken components.

LED technology offers exceptional characteristics in displaying. LEDs can provide high brightness, that can compete with outdoor illumination environments, offer wide color gamut for vivid colors, superb contrast, with total blacks when switched off, and efficient operation with regard to brightness and power consumption. These make them ideal components for future displays, outperforming other display technologies, like LCD, projection, or even OLEDs.

Building a modular 3D light field LED wall style display however raises problems. In previous LED wall displays each pixel is an RGB SMD LED package 21, or composed of 3 separate R, G, B LED chips 22. The typical pixel pitch at such displays is a few mm (it goes from 10 mm down to 1 mm, and just slightly under this at the very latest LED panels), because of physical size and clearance limits. At 3D displays we would also need similar few mm pixel P sizes to have the resolution, like at conventional 2D LED walls, while at the same time for the 3D functionality we would need large number of LED emitters 20, i.e. SMD LED packages 21 or LED chips 22 in the same pixel area, as a contradiction, which is not possible with the SMD LED package 21 or LED chips 22 sizes L, moreover with the necessary technological overhead around them for the wiring and clearances c.

For 3D light field displays we would need very high density LED arrangements that go beyond the physical dimension limitations at known arrangements in the prior art. We describe particular arrangements, where the SMD LED packages 21 or LED chips 22 in the pixel area p shifted substantially corresponding to the extension of the active optical light emission area E of the chip in the shifting direction. In this case we reach the optimum, the theoretical maximum for the number of light beams N to be emitted from the given pixel P size.

Prior art approaches considered the packaged LEDs, SMD LED packages 21 or LED chips 22 as pixels, designing for such pixel and/or sub-pixel lay-outs. In the newly described arrangements we decouple from the outer physical dimensions L of the SMD LED packages 21 or LED chips 22, just considering the active light emission area E of the chips.

Figure 5:
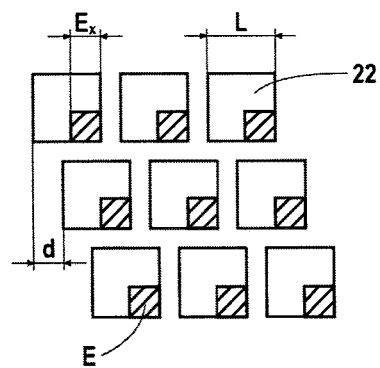

As illustrated in FIG. 5, in case of HOP systems, the SMD LED packages 21 or the LED chips 22 are shifted relative to each other horizontally within the pixel area p with a distance substantially corresponding to the horizontal extension $E_x$ of the light emission area E of the chip. The LED chips 22 sifted with the horizontal extension $E_x$ of their light emission area E relative to each other will be optically neighbors, wherever they are positioned vertically in the pixel area.

Figure 8:
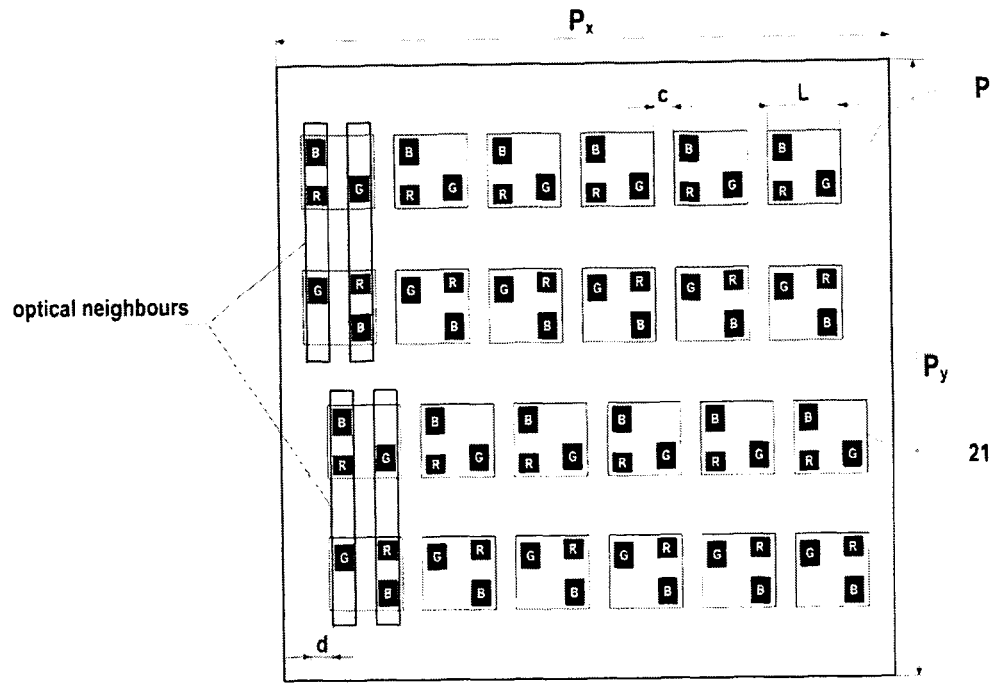

The LED chips 22 belonging to one direction should not even be in the same SMD LED package 21. As illustrated in FIG. 8, the RGB LED chips 22 are enclosed in two physically separate, moreover differently oriented SMD LED packages 21 in rows 1 and 2, still optically constituting one emitting direction. Similarly, the optical neighbors, LED chips 22 associated to the adjacent emitting directions, should not be neighbors physically, they can be located at total different position in the pixel area p, in rows 1-2 and 3-4, respectively, as shown in FIG. 8. It is the horizontal position only that counts.

Figure 9:
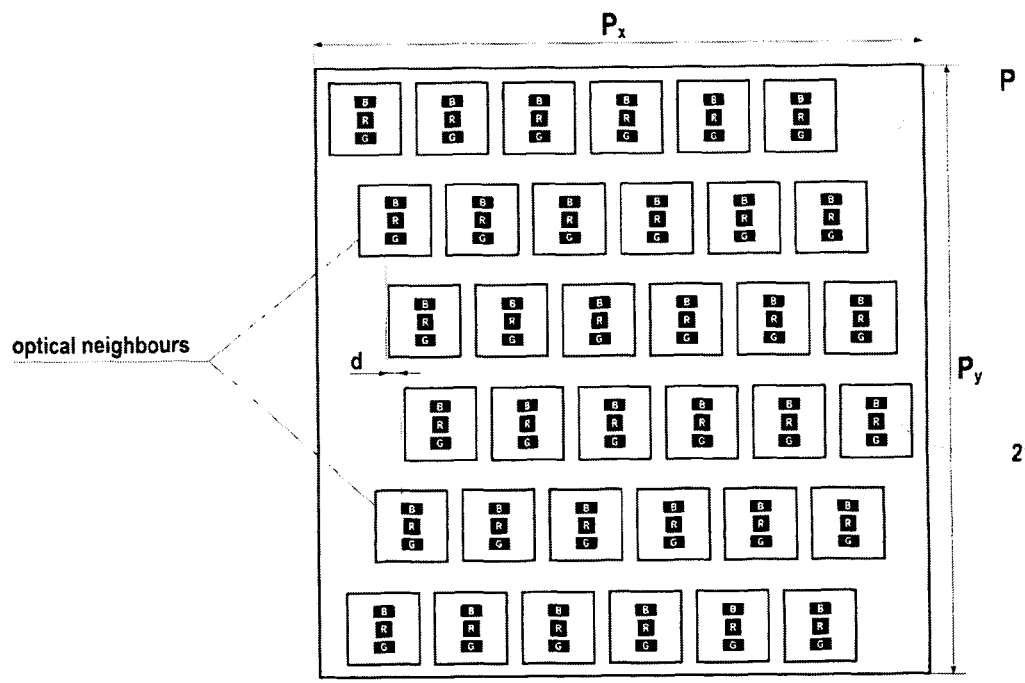

As it can be seen in FIG. 9, even with normal SMD LED packages 21 we can reach optically denser arrangement than the SMD LED package's 21 $L_x$ horizontal size itself would allow. We exploit the whole pixel area p by displacing the SMD LED packages 21 or LED chips 22 vertically, as well, advantageously in multiple rows, but this can be any arrangement, like honeycomb pattern to fill up the pixel area p with LED emitters 20.

Assuming 1:1 aspect pixels, for HOP systems the pixel P size is proportional to the number of light beams N to be emitted, while the pixel area p is proportional to the square function of the pixel P size, hence the larger the pixel area p, the more chips can be placed there. For the simplicity, as a practical example, assuming 0.5 mm square chips in a 5 mm pixel P size 36 directions can be achieved with necessary clearances c, while from a 8 mm pixel P pitch display 100 directions can be generated with the same design overheads, making it ideal for light field displaying.

To this end, even if we could pen more SMD LED packages 21 or LED chips 22 into the pixel P, in case the number of chips would be more than the result of dividing the pixel size $p_x$ by their horizontal active light emitting area E size, that would not bring any further gain. The theoretical maximum of independent, non-overlapping light beams that can be emitted from the pixels is: $N=p_x/E_x$ This is illustrated in FIG. 9, where the SMD LED packages 21 are arranged safely, using the whole pixel area p, keeping standard clearances c allowed by the PCB and pick&placement technologies, still horizontally we reach the maximum optical density with shifts, $d=E_x$.

FIG. 9 shows the optically neighboring SMD LED packages 21 shifted with d. The SMD LED packages 21 are arranged in rows. Advantageously the number of rows and the number of SMD LED packages 21 in the rows are similar, so the number of SMD LED packages 21 in the pixel area p, i.e. the number of views, are typically close to square numbers. As it can be seen in FIG. 9, the optical neighbors are not necessarily in the subsequent row, they can even be at farther vertical position in another row. The rows can be shifted with the multiple of d relative to each other in several variations. FIG. 9 shows a sequence of rows optimized to avoid large vertical jumps in the optically neighboring LED emitter 20 positions, from a row to the other, since that kind of flickering could be visible in the pixels P when the viewer moves from one direction to the neighboring one.

As shown in FIG. 9 in the shifted SMD LED packages 21, multiple LED chips (22), preferably R, G, B LED chips (22) are located in the same horizontal position in the pixel area (p), corresponding to an emitting direction, providing correct color 3D images without directionally displaced coloring effects.

The arrangement is created so that the LED emitters' 20 positions must not extend over the border of the pixel area p and/or the straight oriented border in between the corresponding lenslets 42. If we were using the matching shifted area empty at the neighboring pixel P, the seamless tiling would not be possible.

Such high density LED emitter backplane 30 arrangements are realized by placing and soldering RGB SMD LED packages 21 on multi-layer printed circuit boards (PCBs), as LED board 31. Though the smallest available RGB SMD LED packages 21 from known LED suppliers are needed and advanced PCB technologies should be used, with thin lines, gap clearances c, laser drilled vias, etc., the LED boards 31 however can be manufactured with commercially available components and viable non-research grade technologies. As an additional advantage, following the proposed SMD LED package 21 arrangements, also 2D LED wall panels could be produced, with pitch sizes beyond the current 0.9 mm state-of-the-art. The LED driver electronics 34 advantageously is located on the backside of the PCB with connectors 35 to connect the panels to a common control board 3. The material of the LED emitter backplane 30 can be rigid or flexible PCB material, or any standard TFT backplane material, incl. glass or silicon based substrates.

Another option is the chip-on-board (COB) technology, where the LED chips 22 are directly bond to the PCB 32. This offer several advantages, less overhead with having the pure LED chips 22 without the SMD LED package 21 internal bonding pads, empty areas. We can have more robust, flat surfaces with the modified LED chips 22 directly placed onto the PCB 32 plane. On the other hand sophisticated pick&placement process is needed and each R,G,B LED chips 22 is handled separately. Having no stock item SMD LED package 21 specifics, it is easy to make regular optimum arrangements, as on FIG. 5, with shifted LED chips 22 where the shift is equal to the respective size of the LED chip's active optical light emitting area, d=Ex.

Figure 6:
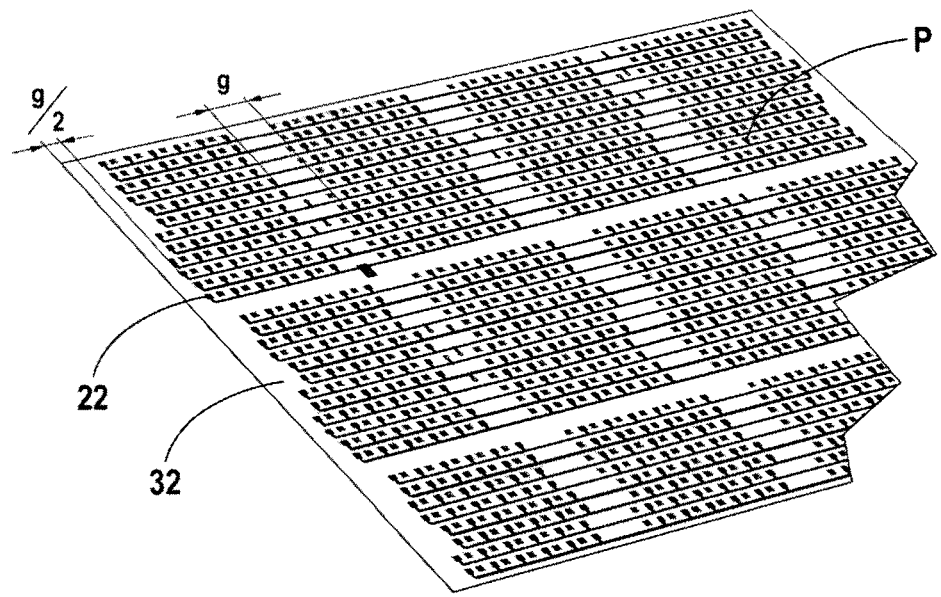

In FIG. 6 there is an example of a chip-on-board arrangement, showing a regular pattern of LED chips 22, grouped in the pixel areas p, separated by gap g, directly bond on the PCB 32 with a g/2 wide empty area of around. The back side of the COB PCB 32 holds the driving electronics, similarly to the previous configuration.

To reach even more dense arrangements and smaller pixel P sizes, the emerging microLED 23 technology offers the solution. MicroLEDs are very small sized LED chips, in the range of 10 microns, transferred to a backplane 33. MicroLED chips 23 are based on conventional GaN LED technology, and for various types the emitting surface can have special 3D structures, like nanowires, which offers far higher total brightness, than e.g. OLED products, as well as higher efficiency in terms of lux/W, and does not suffer from the shorter lifetimes of OLED. The chips are transferred to a thin film transistor (TFT) backplane 33 (LTPS, IGZO) by pick&place technology, or the transfer of a complete microLED array can be performed in one step with, to be attached to a CMOS backplane, called hybridization.

FIG. 10.*a* illustrates a TFT backplane 33 for microLED chip 23 pixels P of a HOP 3D light field display with shifted pattern of transistors. MicroLED chip 23 sizes come in the range from few microns to few-ten microns enabling dense light field displaying with large number of light beams emitted from a small pixel P size.

While for normal LED chip 22 sizes HOP arrangements represent the only realistic option, at microLED chip 23 emitter sizes, very high density arrays for full-parallax arrangements become feasible. 4K microLED array at 6000 ppi density was already demonstrated, which enables a 100 view 3D light field display with less than 0.5 mm pixel P size.

In FIG. 10.*b* similarly, a TFT backplane 33 pixel pattern is illustrated for full-parallax 3D light field microLED displays. For full parallax systems the pattern can be substantially symmetric, as illustrated, but the microLED chip 23 position densities can be different horizontally and vertically, since the microLED chips 23 do not occupy the whole pixel area p and the backplane overheads can be arranged vertically between the chips. By this, the number of horizontal views can advantageously be increased relative to the number of vertical views, distributed over an essentially wider horizontal FOV than vertical FOV.

3D light field displays can emit from each of their pixels P multiple individually controllable light beams into wide angular range α. The light beams from a pixel P cover contiguously this angular range α. Ideally there are no gaps or overlaps, e.g. in case of 100 degrees emission and having N=100 individually addressable light beams, $L_1$ to $L_N$ sequentially from left to right, the divergence δ of each light beam will be 1 degree, forming together a single lobe, as illustrated on FIG. 1.*b*. The role of the panel optics 40 is to collect and direct light from each individually addressable LED emitter 20 into one direction, corresponding to the LED emitter's 20 position within the pixel P, consequently each LED emitter 20 is associated to one and only one direction. This is also true for HOP systems with cylindrical symmetry panel optics 40, that directs the light from the LED emitters 20 in different horizontal positions in the pixel (P) into different directions horizontally, while do not deflect vertically. Without collimation the light beams will spread in a wide angle vertically and the profile of this vertical lobe will correspond to the normal angular emission profile of the LED emitter 20, which relates to the vertical FOV of the 3D display.

As explained, the divergence δ of the light beam is related to the active light emitting area size E, and the optical system should resolve all LED emitters 20 in the far field. To achieve proper optical angular resolution also at wider angle projection, requires multiple optical surfaces, which can remove the limitations related to single element optical systems, i.e. the narrow output angle, determining the FOV, the spot-size, determining the angular resolution of the final display.

Figure 7:
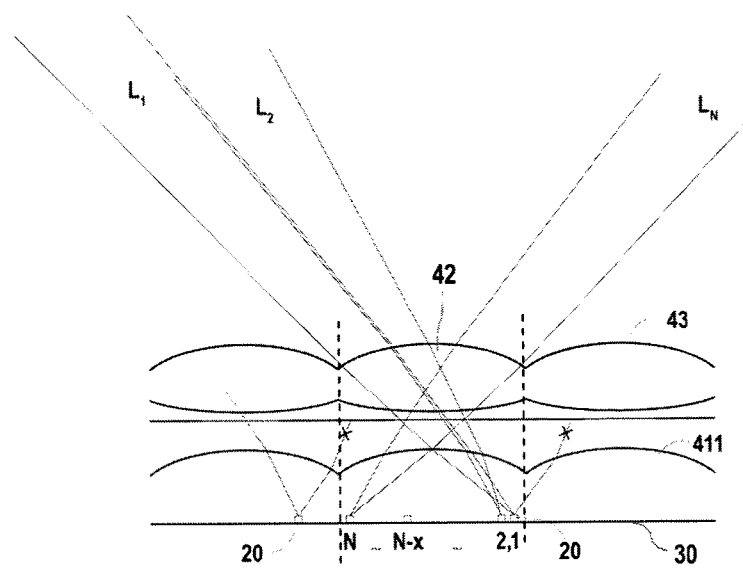

In an embodiment of the invention, as illustrated in FIG. 7, a multiple element optical system is realized with two layers of lens array and proper apertures in between.

FIG. 12.*a* shows a complete HOP panel 10 with the cylindrical lens optical layers 41. FIG. 12.*b*. illustrates the upper view of the HOP panel 10, showing the primary, a second and third optical layers 411, 412, 413, respectively, the LED board 31 with the driving electronics 34 on the back side connected with a connector 35 to the control board 3.

Figure 4:
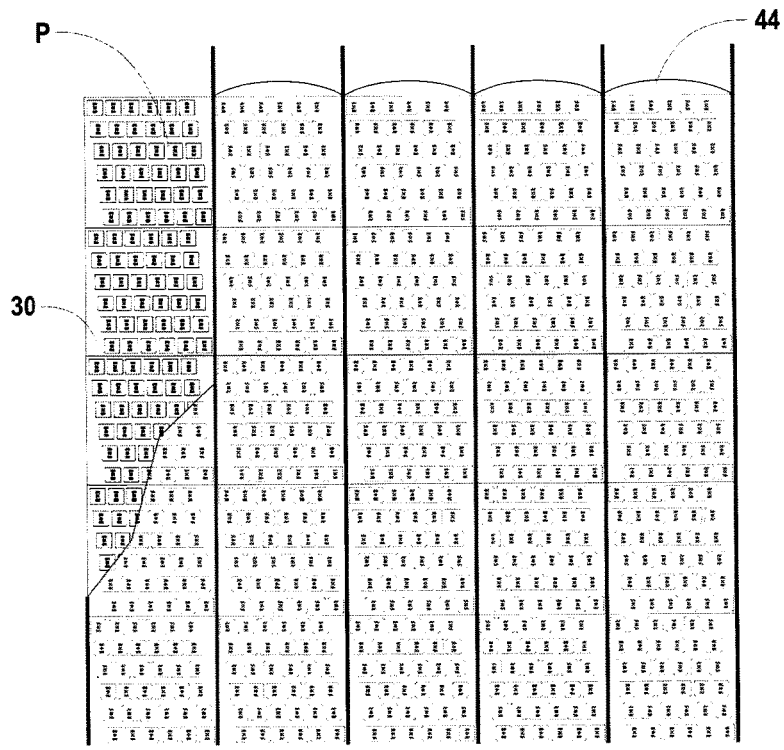

As seen in FIGS. 12.*a*,*b*, the panel optics 40 is realized as stacked optical plates 46 of multiple layers of lens arrays 43. For HOP system layers of cylindrical lens arrays 44, see FIG. 12.*a*, while for full-parallax system spherical symmetry lens arrays 45, see FIG. 11.*a*, which can include in both cases aspheric optical surfaces. The lens arrays 43 can be single sided, with one optical surface, containing plano-convex or plano-concave lenslets 42, or double sided, with two optical surfaces, consisting of convex or concave lenslets 42. The optical plates 46 are overlaid on the LED emitters 20 on the LED backplane 30, as shown on FIGS. 11.*a* and 12.*b*. The size of the optical plates 46 is exactly the same as the LED backplane 30 size, as on FIG. 12.*a*, the lenslets' 42 pitch is the same as the pixel P period, as shown on FIG. 4, and the optical plates 46 comprise integer number of lenslets 42. While a contiguous periodic structure is formed, to each pixel P belong a lenslet 42, in HOP structure a cylindrical lenslet 42 belongs vertically to more pixels P in the column, the lenslets 42 and the part of optical layers 41 belonging to a pixel P let through light only from the LED emitters 20 in the belonging pixel area p and the multilayer optical structure is configured to block light from the other pixels P.

The optical plates 46 can be made of glass or advantageously optical plastics, such as PMMA, polycarbonate, offering lightweight, still robust optical surface to the display. Plastic optical plates 46 represent the best option for mass-produced optical components. The optical plates 46 can be manufactured by injection moulding cost-effective in large volumes. The optical plates 46 can be cemented to the LED board 31 and to each other by optical glues.

As an advantageous embodiment for large volume production, is to realize the first lens layer 411 as a single optical surface lens, see FIGS. 11.*a* and 12.*b*, so that the first layer of lenses 411 can directly be bond to the LED board 31.

The first lens layer 411 can directly be overmoulded on the LED board 31 in a hybrid in-mould process. The readymade LED board 31 or LED backplane 30 is put into the mould, containing the optical insert, as the optical master of the first lens array 411, and the injection moulding is performed in one step, i.e. of the melted optical plastic material is directly pressed on to the LED board 31 to form a lens array 43, 411 surface.

It is also possible to produce the lens layer 411 by optical 3D printing process, particularly for specific custom parameters.

The multiple optical layers 41 in the panel optics 40 may be realized as stacked optical plates 46, the optical layers 41 further comprising at least one element selected from the group comprising multiple optical surfaces, incl. aspherical surfaces, apertures, optical surfaces with diffusing characteristics, shading structures, painted shapes, optical coatings, antireflective, antiglare layers or coatings, scratch resistant protective layers or coatings on the outer surface, etc.

FIG. 11. a illustrates a full-parallax panel 11. The panel comprising a TFT backplane 33 holding microLED chips 23, assembled with a multi-layer spherical symmetry optical lens array 45 overlay. Both the backplane 33 and the panel optics 40 overlay size is the same and equal to the panel 11 size. The microLED chips 23 are transferred onto the TFT backplane 33 and the microLED chips 23 are arranged in groups, constituting pixels P, as shown on FIG. 10 b. The microLED chips 23 are arranged over the entire backplane 33 area without a wider inactive boundary around the edges, the maximum width of the inactive area around the edges is less than the half of the pixel gap g, i.e. g/2. Contrasting conventional microdisplay lay-outs, with bonding pads and driver structures on the chip around the active light emission area, the microLED array on silicon substrates in the suggested arrangement cover the entire substrate area up to edges of without an inactive boundary around, or just a technology frame with a maximum width of g/2 only. MicroLED chips 23 occupy just a part of the full pixel area p, so the column/row driver chips could also be placed in between, on the front side. Through holes (vias) or wiring structured around the edges connect the front and back sides of the TFT backplane 33. The TFT backplane 33 can be fine structured PCB, or other TFT substrate, with the connections configured on the rear side, to connect the panel 11 to the control board 3.

FIG. 11. b Illustrates full-parallax microLED panels 11 connected to the common control board 3. The control board 3 controls the panels' 11 microLED driver electronics, distributes the signal and provide the power supply for the panels 11. The structure is scalable and it is possible to make various sized assemblies, as indicated in the FIG. 11.b.

A preferred embodiment for TV style full-parallax 3D microLED displays is to set the common control board 3 in the size of the final display, preferably with 16:9 aspect, with seamlessly tiled full-parallax panels 11 placed along the entire front side. All necessary TV and display related inputs and control functionalities can be integrated on the other side of the control board 3 to have a fully functional 3D light field microLED display. These units can also be considered, as cabinets, to build bezel-free configurations of 3D video walls, extended on larger surfaces, with just of a few centimeter thickness.

Figure 18:
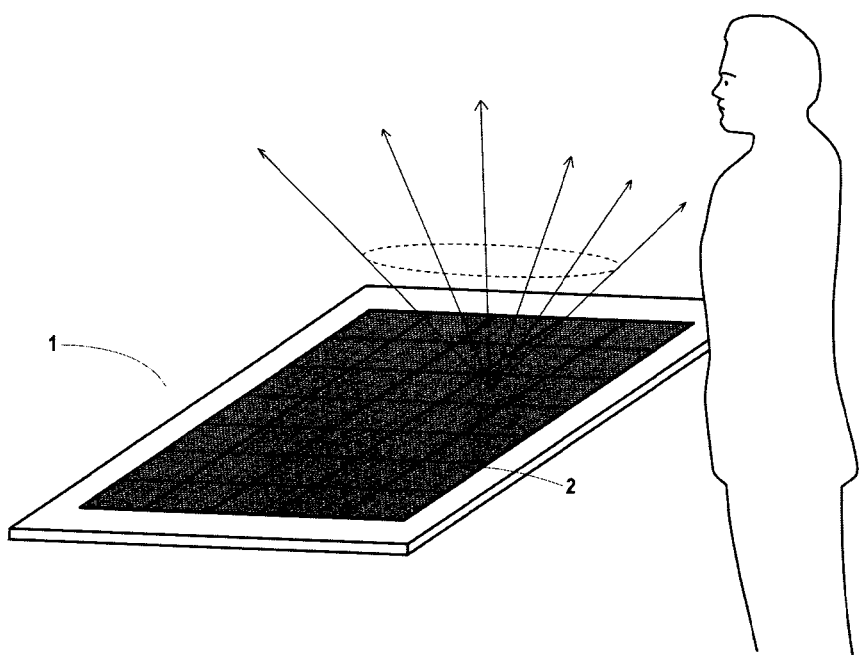

As an additional advantage of full-parallax 3D systems that they can be used both in vertical and horizontal orientation, opening a wide range of applications, as shown on FIG. 18.

FIG. 13 illustrates a cabinet 2 of completely assembled HOP panels 10. Organizing panels 10 into cabinets 2, as larger units, can help the practical assembly of larger displays. The cabinets 2 are self-supporting units, with mechanics 4 holding the panels, providing mechanical robustness and the cooling. The mechanical housing is configured with precise fixing pods, so that the cabinet 2 can be seamlessly tiled with other cabinets 2. The cabinet 2 further comprises a common control board 3 the panels 10 are connected to. The control board 3 controls the LED driver chips 34 in the panel 10 electronics, distributes the video signal corresponding to each of the panels 10 and comprises the power supply for the panels 10. The control board 3 has input and output connectors 5. The signal input/output can be Gigabit Ethernet, or HDMI, or Display Port (DP), or similar high speed video or data connection, while the power input can advantageously be 230/110 AC, or lower voltage DC. The cabinet 2 can be square shaped, as on FIG. 13, or 16:9 to easily tiled for similar aspect display. It can be a bigger unit consisting of more panels 10, making easier to build larger display walls, or can be smaller, with fewer panels 10, which is more advantageous in shaping curved surfaces displays.

The overall system architecture is shown on FIGS. 14. a, b, c.

FIG. 14.a shows the panel 10 comprising of the LED panel 30 with the LED emitters 20, the panel optics 40 including multiple stacked optical plates 46 and the LED driver electronic 34 on the back side. The same architecture applies for both HOP or for full-parallax panels 10, 11, respectively.

FIG. 14.b showing the cabinet 2 comprising multiple panels 10, the common control board 3 with the input and output connectors 5 and the self-supporting mechanics 4 holding the panels 10 and the control board 3 with connectors 5. The input can be Gigabit Ethernet, or HDMI, or Display Port (DP), or similar high speed video or data connection. The cabinet 2 itself is a fully functional 3D light field display unit.

FIG. 14.c is showing the tiled, complete modular large-scale 3D light field display 1. The display 1 is composed of cabinets 2, and following the structure, larger, seamlessly tiled assemblies can be built. The input the final display 1 is the input of one of the cabinets 2, with the same Gigabit Ethernet, or HDMI, or Display Port (DP), or similar high speed video or data connection. The cabinets 2 are interconnected in a chain, and through this link they are also communicating their position in the display 1 wall and the system control board 3 will distribute the video content accordingly and the cabinets 2 will access the content dedicated to them.

Figure 15:
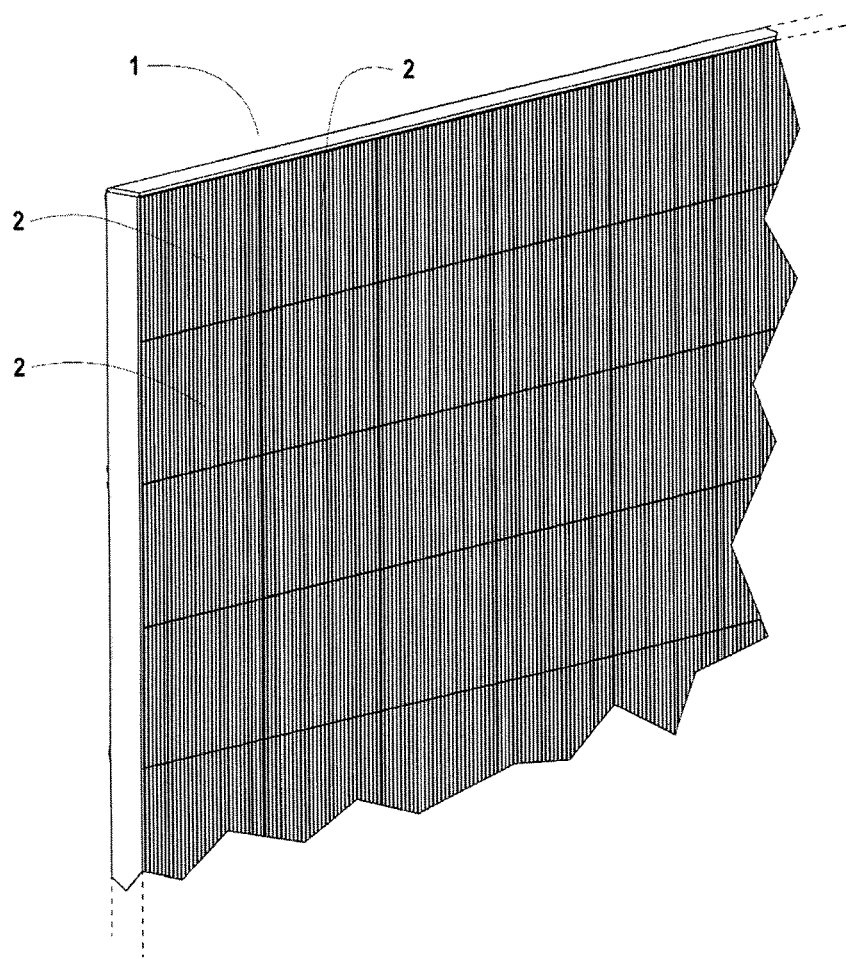

FIG. 15 illustrates a seamlessly tiled 3D light field LED display 1 wall. With the modular structure larger 3D light field LED display assemblies can be built. The assemblies can be of any size, any aspect, any shape, incl. curved surfaces displays enabling creative uses. The aspect of the final display can be 16:9, conforming to TV standards, or can be wider of 21:9 aspects, conforming to 3D cinema screen applications.

Figure 16:
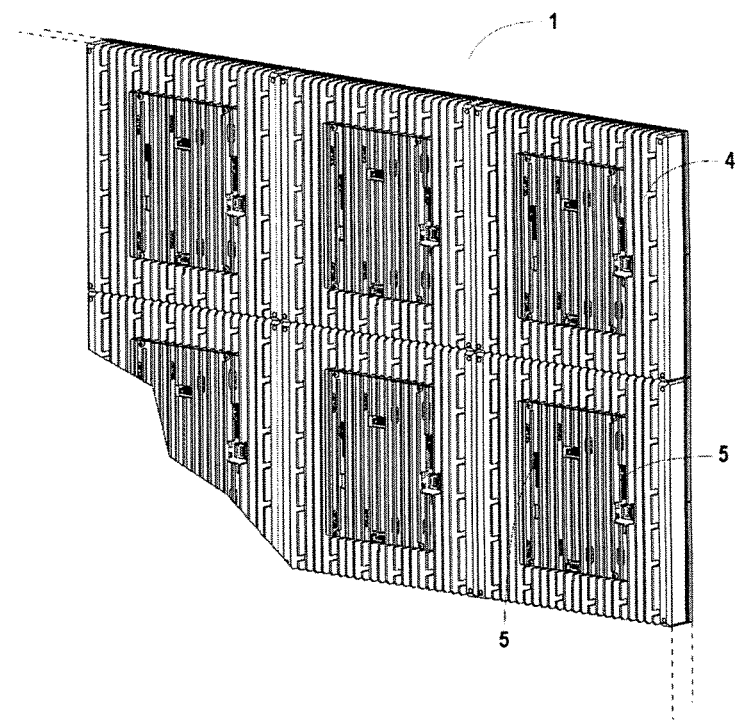
Figure 17:
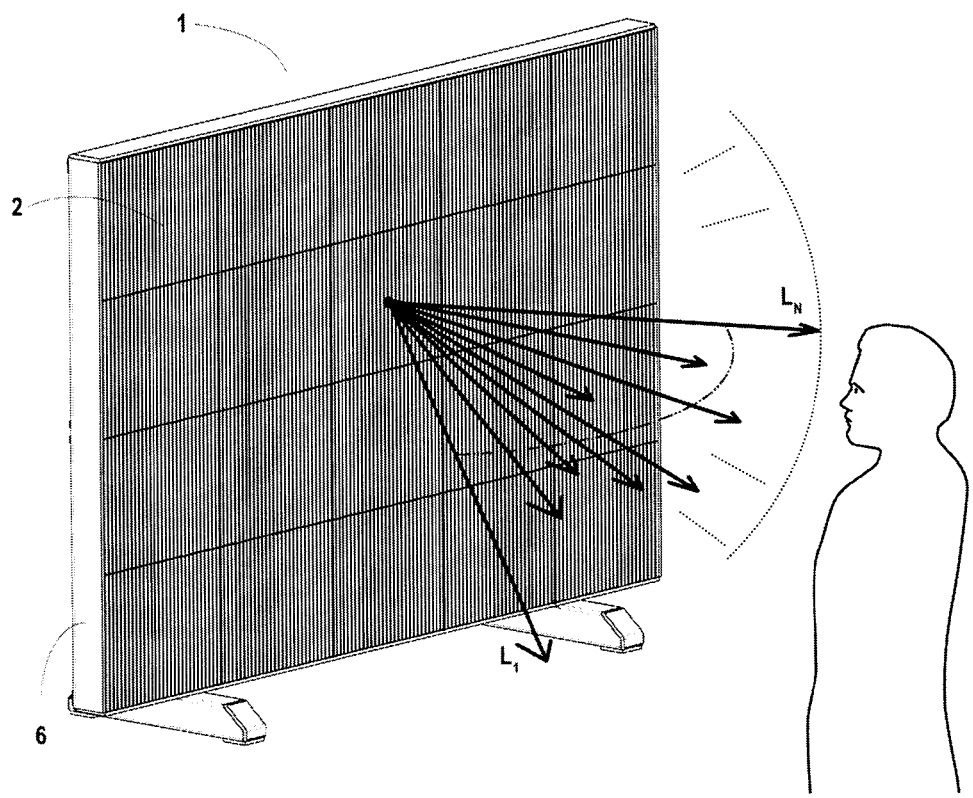

FIG. 16 shows the 3D LED wall display assembly from the back, with the cabinet 2 mechanics 4 configured for the seamless tiling, with strong mechanical connections, advantageously having a ribbed rear, to be lightweight and rigid, with heatsink like shapes enabling the effective cooling. The mechanical envelop contains the control board 3, the connectors 5, which are shown without the cabling, and optional openings for feedback lights and service programming connectors. The complete display mechanics can be fixed to walls, can be hang from above with stays, or can be self-standing integrated into outer mechanical frame or decorative cover FIG. 17 shows a HOP 3D light field LED wall display assembly, illustrating also the vertical lobes of the horizontally different light beams $L_1 \ldots L_N$ FIG. 18 shows a complete seamlessly tiled full-parallax 3D light field LED display used in horizontal orientation.

The invention claimed is:
1. Modular 3D light field LED wall display composed of uniform panels (10), connected to each other mechanically and electrically, each of the uniform panels (10) comprising
    a LED backplane (30) delimited by edges, comprising pixels (P) with a pixel area (p), the pixels being separated from each other by a gap (g) and each of the pixels incorporating multiple LED emitters (20),
    an optical means placed over the LED emitters (20) to direct multiple light beams into multiple directions from each pixel, the panels further comprising LED driver electronics (34) and connectors (35), characterized in that the LED emitters (20) are arranged in a predetermined pattern within a pixel area (p) with a number of LED emitters (20) being selected in accordance with the number of desired viewing directions, wherein the optically neighboring LED emitters (20) are shifted relative to each other corresponding to the extension of the light emission area (E) of the LED emitter (20), each LED emitter (20) is associated to one direction of emitted light beam ($L_1 \ldots L_N$) as a function of its position within the pixel area (p) and the LED emitters can be individually controlled, and the optical means is realized as a panel optics (40) having the same size and form as the panel, comprising multiple optical surfaces, forming a lens array, containing integer number of straight oriented lenslets (42) with straight edges, corresponding to the pixel (P) arrangement, forming a seamlessly tile-able array, the light beam from each LED emitter (20) is directed into one direction by the panel optics (40), and the light beams ($L_1 \ldots L_N$) emitted from the pixel (P) into the multiple directions have a divergence d in order to cover a contiguous angular range a in a single lobe, the multiple light beams ($L_1 \ldots L_N$) from all the pixels (P) generate a continuous 3D light field, reproducing light beams with the substantially same parameters, as present in the natural view, providing a natural 3D view over a wide field-of-view (FOV).

2. The 3D light field LED wall display of claim 1, wherein the LED emitters (20) are selected from the group comprising SMD LED packages (21) including more chips, particularly R,G,B LED chips (22), LED chips (22), microLEDs chips (23), and microLED array.

3. The 3D light field LED wall display of claim 1, wherein the panel (10, 11) comprising a LED backplane (30), with LED emitters (20) arranged in a periodic structure of pixels P up to the edges of the LED backplane (30), with an inactive boundary along the edges having the width (W) of less than the half of the gap (W=g/2) separating the pixels.

4. The 3D light field LED wall display of claim 1, wherein the panel optics (40) comprises one or more optical layers (41) forming a tile-able lens array (43), consisting of lenslets (42) of corresponding dimensions as the pixels (P), the optics associated to a pixel project substantially collimated light beams only from the LED emitters (20) located in the associated pixel area p, while blocking light in the main deflection directions from the LED emitters (20) in the neighboring pixel areas p.

5. The 3D light field LED wall display of claim 4, wherein the multiple optical layers (41) in the panel optics (40) are realized as stacked optical plates (46), made of glass or various optical plastics, the optical layers (41) further comprising at least one element selected from the group comprising multiple optical surfaces, incl. aspherical surfaces, apertures, optical surfaces with diffusing characteristics, shading structures, painted shapes, optical coatings, antireflective, antiglare layers, scratch resistant protective layers on the outer surface, etc.

6. The 3D light field LED wall display of claim 1, comprising fill-parallax 3D LED panels (11), comprising microLED chips (23) on a TFT backplane (33) with the panel optics (40) comprising multiple layers of spherical lens arrays (45), realized as optical plates (46), wherein the TFT backplane (33) and the panel optics (40) overlay size is substantially equal to the panel (11) size, and the microLED chips (23) are arranged in groups, constituting pixels P, over the entire backplane (33) area up to the edges of the FL backplane (33), with an inactive boundary along the edges having the width of less than the half of the gap (W=g/2) separating the pixels.

7. The 3D light field LED wall display of claim 6, comprising full-parallax 3D LED panels (11), wherein multiple microLED panels (11) comprising LED driver electronics (34) and connectors (35) are placed seamlessly tiled to each other and connected to a common control hoard (3), having input connectors (5), in a mechanics (4), realizing a fully functional 3D display unit.

8. The 3D light field LED wall display of claim 1, wherein the panel optics (40) comprises one or more optical layers (41) of cylindrical lens arrays (44), realized as optical plates (46), and the LED backplane (30) is realized as a multi-layer printed circuit hoard (31, 32) holding the SMD LED packages (21), the directly bond LED chips (22), or a TFT backplane (33) holding the microLED chips (23), and the panel (10) further comprising LED driver electronics (34) and connectors (35).

9. The display of claim 8, wherein the LED emitters (20), selected from the group comprising LED chips (22), SMD LED packages (21) including more chips, particularly R,G,B LED chips (22), microLEDs chips (23), are shifted relative to each other horizontally within the pixel area (p) with a distance (d) substantially corresponding to the horizontal extension ($E_x$) of the light emission area (E) of the LED emitter (20), and the shift (d) is in a range between ½ $E_x$ and 10 $E_x$, preferably in a range between ½ $E_x$ and 5 $E_x$ and even more preferably in a range between ½ $E_x$ and 2 $E_x$.

10. The 3D light field LED wall display of claim 8, wherein multiple LED chips (22), preferably R, G, B LED chips (22) are located in the same horizontal position within the pixel area (P) corresponding to an emitting direction.

11. The display of claim 8, wherein LED emitters (20) in the pixel area (p) are arranged in rows, with a period substantially corresponding their physical dimension (L) and the necessary clearances (c), the pixel area (p) containing multiple rows, each shifted substantially with $E_x$ relative to each other, where the optically neighboring LED emitters (20) are placed in subsequent rows, or advantageously in rows other than the adjacent row.

12. The display of claim 8, wherein the panel optics (40) comprises two lens layers (411, 412) forming a cylindrical lens array (44) with apertures between the lenslets (42) wherein the first lens layer (411) focuses the beams horizontally into corresponding vertical aperture stripes, the second lens layer (412) targets the light beams into final directions without vertical deflection, and the first layer (411) is directly bond or overmoulded to the LED backplane (30).

13. The 3D light field LED wall display of claim 1, wherein the LED emitters (20) are arranged with a shift (d) larger than horizontal extension ($E_x$) of the light emission area (E) of the LED emitter (20), and the panel optics (40) is slightly defocused, or incorporates a corresponding diffusing functionality.

14. The 3D light field LED wall display of claim 1, assembled of at least one cabinet (2), each of the cabinets (2) comprising multiple uniform seamlessly, tiled panels (10, 11), a control board (3) with input and output connectors (5) and a self-supporting mechanics (4) for holding the panels (10, 11), and the panels (10, 11) are connected to and controlled by the control board (3) through connectors (35), the control board (3) controls the panel's (10, 11) LED driving electronics (34), distributes a video signal corresponding to each of the panels (10, 11), provides power supply for the panels (10, 11), further the control board (3) has input and output connectors (5), external control connectors, power input connector, and the cabinet (2) being itself a fully functional 3D light field display unit.

15. The 3D light field LED wall display of claim 1, comprising a control system that can store calibration data, obtained from a calibration camera or other sensors, to compensate the geometry and color distortions of the assembled 3D display.

16. Method for displaying 3D light field images on a 3D light field LED wall display composed of uniform panels (10), connected to each other mechanically and electrically, each of the uniform panels (10) comprising
    a LED backplane (30) delimited by edges, comprising pixels (P) with a pixel area (p), the pixels being separated from each other by a gay (g) and each of the pixels incorporating multiple LED emitters (20),
    an optical means placed over the LED emitters (20) to direct multiple light beams into multiple directions from each pixel (P),
    the panels further comprising LED driver electronics (34) and connectors (35), the method comprising the steps of
    arranging LED emitters (20) in each pixel area (p), with a number of LED emitters 20 being selected in accordance with the number of desired viewing directions, wherein the optically neighboring LED emitters (20) are shifted relative to each other corresponding to the extension of the light emission area (E) of the LED emitter (20)
    individually controlling each of the multiple LED emitters (20) in each of the pixel areas (p),
    directing the light beam from each LED emitter (20) into one direction by the panel optics (40), thereby
    generating light beams ($L_1 \ldots L_N$) for each view in a single lobe, and providing each beam of the single lobe with a divergence d to contiguously cover the angular range a,
    seamlessly tiling the panels (10) into an assembly, and the multiple light beams ($L_1 \ldots L_N$) emitted from all the pixels (P) of the multiple panels (10) generate a continuous 3D light field, emitting light beams with substantially the same parameters, as present in the natural view to provide a natural 3D view over a wide field-of-view (FOV).

17. The method of claim 16 further comprising the steps of
    arranging LED emitters (20) in the whole pixel area (p) in vertical and horizontal positions,
    shifting the LED emitters (20) relative to each other horizontally with a distance d, substantially corresponding to the horizontal extension $E_x$ of the light emission area (E) of the LED emitters (20), and creating horizontally optically adjacent LED emitters (20) with substantially touching emission areas (E),
    directing the light beam received from each LED emitter 20 by the panel Optics (40) into one horizontal direction, as a function of the horizontal position of the LED emitters (20) in the pixel area (p), without deflecting vertically,
    emitting large number vertically extended lobes of the horizontally different light beams ($L_1 \ldots L_N$) from the pixel (P), from the horizontally optically adjacent LED emitters (20).

* * * * *